United States Patent [19]

Arakawa et al.

[11] Patent Number: 4,470,063

[45] Date of Patent: Sep. 4, 1984

[54] COPPER MATRIX ELECTRODE HAVING CARBON FIBERS THEREIN

[75] Inventors: Hideo Arakawa; Keiichi Kuniya; Takashi Namekawa; Masabumi Ohashi, all of Hitachi, Japan

[73] Assignee: Hitachi, Ltd., Tokyo, Japan

[21] Appl. No.: 322,699

[22] Filed: Nov. 18, 1981

[30] Foreign Application Priority Data

Nov. 19, 1980 [JP] Japan ................................ 55-162022

[51] Int. Cl.³ ................. H01L 23/48; H01L 29/40; H01L 23/02; H01L 29/46
[52] U.S. Cl. ......................... 357/67; 357/65; 357/68; 357/72; 357/81
[58] Field of Search .............. 357/65, 68, 67, 72, 357/81; 361/386; 75/DIG. 1

[56] References Cited

U.S. PATENT DOCUMENTS 4,196,442  4/1980  Kuniya et al. ..................... 357/67

Primary Examiner—Andrew J. James
Assistant Examiner—John LaMont
Attorney, Agent, or Firm—Antonelli, Terry & Wands

[57] ABSTRACT

A semiconductor device includes a semiconductor substrate having electrodes brazed thereto. The electrode is made of a Cu-C composite material in which carbon fibers are embedded in copper matrix. The carbon fibers are so disposed as to be in a ring-like shape or a loop shape substantially in parallel with a surface of the semiconductor substrate onto which the electrode is brazed. The carbon fibers disposed in an outer peripheral portion have a higher longitudinal elastic modulus than that of the carbon fibers positioned at a central portion of the electrode. The electrode thus has a thermal expansion coefficient approximating to that of the semiconductor substrate. Content of copper can be increased at the central portion of the electrode for attaining a high thermal conductivity.

16 Claims, 3 Drawing Figures

COPPER MATRIX ELECTRODE HAVING CARBON FIBERS THEREIN

BACKGROUND OF THE INVENTION

The present invention relates generally to a semiconductor device and in particular concerns a supporting electrode brazed to a semiconductor substrate of the semiconductor device, which electrode is made of a composite material containing carbon fibers in a matrix of copper.

In many semiconductor devices, the semiconductor substrate is brazed onto electrodes which serve also as the support for the substrate. In order that thermal stress produced during fabrication or operation of the semiconductor device be abated or suppressed and that heat generated in the semiconductor substrate be satisfactorily dissipated, it is required that the electrode should have following properties:

(1) Thermal expansion coefficient of the electrode should approximate to that of the semiconductor substrate as closely as possible.
(2) The electrode should exhibit a high thermal conductivity.

Tungsten and molybdenum have heretofore been used as preferred electrode materials for satisfying the requirements mentioned above. However, in view of the fact that the coefficient of thermal expansion (hereinafter referred to as the thermal expansion coefficient) of silicon of which the semiconductor substrate is made is $3.5 \times 10^{-6}/°C$. in contrast to those of tungsten and molybdenum which are $4.5 \times 10^{-6}/°C$. and $5.5 \times 10^{-6}/°C$., respectively, it can not always be said that tungsten and molybdenum are very satisfactory. Further, thermal conductivities of these elements are poor when compared with copper.

As an electrode material which is to replace tungsten and molybdenum, a composite material in which carbon fibers are embedded in copper matrix has been proposed (refer to U.S. Pat. No. 3,969,754, for example). This composite material enjoys both a low thermal expansibility attributable to the carbon fibers and a high thermal conductivity ascribable to the presence of copper. Besides, by adjusting the content of the admixed carbon fibers, it is possible to make the thermal expansion coefficient of the composite material coincide with that of the substrate material. However, when the content of the carbon fibers is increased, the thermal expansion coefficient of the composite electrode material is decreased and at the same time the thermal conductivity is also decreased because of inherently poor thermal conductivity of the carbon fibers per se. Under the circumstance, there is a demand for realization of an electrode of such a composite material in which thermal conductivity is improved by reducing the content of the admixed carbon fibers while satisfying the requirement of the low thermal expansibility. When an electrode of the composite material which meets the above demand is employed in a semiconductor device, the semiconductor substrate will then be substantially insusceptible to thermal stress, while heat generated in the substrate can be dissipated in a satisfactory manner. Thus, with such an electrode, a semiconductor device would be obtained which can enjoy a high stability with respect to electrical and mechanical characteristics and which can assure satisfactory operation even in the state where a large current is handled.

SUMMARY OF THE INVENTION

An object of the present invention is to provide a semiconductor device which can be operated satisfactorily even when a large current is conducted.

Another object of the invention is to provide a semiconductor device incorporating electrodes made of a composite material in which carbon fibers are embedded in copper matrix and which exhibits a low thermal expansibility and a high thermal conductivity.

According to an aspect of the invention, electrodes brazed to a semiconductor substrate for the support thereof are made of a composite material in which carbon fibers are embedded in a ring-like shape or in a loop shape in a copper matrix, the ring-like shape or the loop shape being substantially parallel with the surface of the substrate to which the electrode is bonded, wherein at least the carbon fibers embedded at an outer peripheral portion of the electrode exhibit a higher longitudinal elastic modulus than that of the carbon fibers embedded at a central portion of the electrode.

In the electrode brazed to the substrate for serving also as the support therefor, it is desirable that the thermal expansion coefficient of the electrode be equal to that of the semiconductor substrate, provided that the thermal expansion coefficient of the electrode in the direction parallel to the plane of the substrate supporting surface thereof is decreased. It is unnecessary that the thermal expansion coefficient of the electrode in the direction perpendicular to the plane of the supporting surface approximates to that of the semiconductor substrate. However, it is required that the thermal conductivity of the electrode in the perpendicular direction be high, because a heat dissipating fin is mounted in the direction perpendicular to the plane of the substrate supporting surface of the electrode.

Further, it is necessary that no anisotropy appears concerning the thermal expansion coefficient in the substrate supporting surface of the electrode.

As to the geometrical structure of the composite material for the electrode in which the carbon fibers are embedded in a carbon matrix (this material will hereinafter be referred to as the Cu-C composite material), there may be conceived a net-like structure in which the carbon fibers are embedded in a net-like pattern or array, a two-directional structure in which the carbon fibers are orientated at least in two directions, a radial structure in which the carbon fibers are arrayed in a radial pattern, an annular structure in which the carbon fibers are disposed in an annular array and a spiral structure in which the carbon fibers are coaxially arrayed or disposed. Among them, the spiral structure of the Cu-C composite electrode material is preferred in view of a small thermal expansion coefficient and a high thermal conductivity.

In general, the thermal expansion coefficient $\alpha_c$ of the Cu-C composite material in one direction in which the carbon fibers are orientated is given by the following expression:

$$\alpha_c = \frac{\alpha_f \cdot E_f V_f + \alpha_m \cdot E_m(1 - V_f)}{E_f \cdot V_f + E_m(1 - V_f)} \qquad (1)$$

where $\alpha_f$ and $\alpha_m$ represent thermal expansion coefficients of carbon and copper, respectively, $E_f$ and $E_m$ represent longitudinal elastic moduli of carbon and copper, respectively, and $V_f$ represents a mixing ratio or content of carbon.

The expression (1) will fundamentally apply not only to the one-directional Cu-C composite material but also to the Cu-C composite materials of various structures mentioned above. In particular, experiments performed by the inventors of the present application shows that the expression (1) applies validly to the Cu-C composite electrode material of the spiral fiber array.

As can be seen from the expression (1), the thermal expansion coefficient $\alpha_c$ of the Cu-C composite material depends on the parameters $\alpha_f$, $E_f$ and $V_f$ of carbon. In order to realize the composite material of a small or low thermal expansion coefficient, the carbon fibers having a high longitudinal elastic modulus and a small thermal expansion coefficient should be admixed in a large amount, which however will result in a decreased thermal conductivity, as described hereinbefore.

In the light of the foregoing, it is proposed according to a preferred embodiment of the invention that the carbon fibers of a high longitudinal elastic modulus are disposed at least at an outer peripheral portion of the electrode, while the carbon fibers of a low longitudinal elastic modulus are admixedly embedded within the electrode at a central portion thereof. With this structure, the carbon fibers of a high longitudinal elastic modulus disposed in the outer peripheral region of the electrode serve to restrict the thermal expansion of the central portion of the electrode, whereby a low thermal expansion coefficient can be attained as a whole throughout the electrode, while an improved thermal conductivity is accomplished by a reduced content of the carbon fibers at the central portion of the electrode.

DESCRIPTION OF THE PREFERRED EMBODIMENTS

Figure 1:
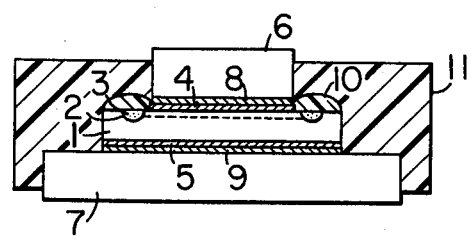
FIG. 1 is a partially sectional view showing a semiconductor device according to an embodiment of the invention.

Referring to FIG. 1, a reference numeral 1 denotes a silicon substrate having a single pn-junction. A groove 2 is formed in an upper principal surface of the silicon substrate along a peripheral edge portion thereof. The pn-junction is exposed in the groove 2. A passivation glass layer 3 is deposited through a firing process to cover the exposed pn-junction. Electrode films 4 and 5 made of nickel or the like are provided on the upper principal surface at the area enclosed by the groove 2 and a lower principal surface, respectively. Electrodes 6 and 7 made of a Cu-C composite material (also referred to as the Cu-C composite electrode) are bonded to the electrode films 4 and 5, respectively, through interposed solder layers 8 and 9, respectively. To protect the passivation glass layer 3, a buffer layer 10 formed of silicone rubber or the like is deposited over the groove 2. The whole assembly thus obtained is embedded in an epoxy resin block 11 through a molding process. Heat dissipating fins (not shown) having high electrical and thermal conductivity are disposed in intimate contact with the respective electrodes 6 and 7 of the Cu-C composite material. Electrical connection to the semiconductor element is made by way of the heat dissipating fins.

The electrode of Cu-C composite material was fabricated through a procedure described below.

A first bundle of 3000 carbon fibers each having a longitudinal elastic modulus of 20,000 to 31,000 kg f/mm² and a diameter of 6 to 7 μm and plated with copper in thickness of about 1 μm was prepared. This bundle is referred to as the carbon fiber bundle of low longitudinal elastic modulus (i.e. low modulus of longitudinal elasticity). A second bundle of 3000 carbon fibers each having the longitudinal elastic modulus of 36,000 to 45,000 kg f/mm² and a diameter of 6 to 9 μm and plated with copper in thickness of about 1 μm was prepared. This bundle is referred to as the carbon fiber bundle of high longitudinal elastic modulus.

On the other hand, pulverized copper having a particle size of the order of 1 μm and an aqueous solution of methyl cellulose were mixed together to prepare a muddy or paste-like slurry of pulverized copper.

Both the fiber bundles of the high and low longitudinal elastic moduli were impregnated with the pulverized copper slurry in such a degree that the content of the carbon fibers amounted to 45% by volume.

Next, the first carbon fiber bundle of the low longitudinal elastic modulus impregnated with the pulverized copper slurry as mentioned above was wound around a copper rod having a diameter of 3 mm to the extent that the diameter of the winding was 20 m. Additionally, the second carbon fiber bundle of the high longitudinal elastic modulus impregnated with the pulverized carbon slurry as described above was wound around the wound layer of the first carbon fiber bundle up to the winding diameter of 30 mm.

Subsequently, the copper core rod was extracted and the resultant cavity was filled with the slurry of pulverized copper.

The composite electrode assembly thus prepared was subjected to a hot press process within a mold of graphite at a temperature of 1000° C. under pressure of 250 kg f/cm². There was thus obtained a spirally wound electrode of the Cu-C composite material having a diameter of 30 mm and a thickness of 3 mm, which electrode is to serve as the electrode 7 shown in FIG. 1.

Thermal expansion coefficient of the composite electrode 7 was measured in the diametrical direction thereof (i.e. in the direction parallel to the bonding surface of the silicon substrate 1) over a temperature range of a room temperature to 300° C. The mean thermal expansion coefficient as measured was $3.6 \times 10^{-6}$/°C. This value approximates very closely to the thermal expansion coefficient of silicon which is $3.5 \times 10^{-6}$/°C. The thermal conductivity of the electrode 7 was about 2.0 W/cm°C. as measured through the flash method.

For the purpose of comparison, an electrode was made by using only the carbon fiber bundle of the low longitudinal elastic modulus on the same fabricating conditions. In the case of this electrode, it was found that the content of the admixed carbon fibers was required to be increased up to 55 to 58% by volume in order to obtain the same mean thermal expansion coefficient (i.e. $3.6 \times 10^{-6}$/°C.). The thermal conductivity of the composite electrode made of only the carbon fiber bundle of the low longitudinal elastic coefficient was measured to be 1.2 to 1.6 W/cm° C.

It will be appreciated from the above comparison that the amount of the carbon fibers can be reduced by 10 to 13% by volume for attaining the same thermal expansion coefficient while the thermal conductivity being increased by 0.4 to 0.8 W/cm²° C. in a electrode of the Cu-C composite material fabricated according to the teaching of the invention.

The electrode 6 can be realized through the same procedure as the electrode 7 described above and differs from the latter only in the size. Accordingly, further description of the fabricating process of the electrode 6 will be unnecessary.

Thus, there has been provided according to the invention a semiconductor device in which the coefficient of thermal expansion of the silicon substrate approximates very closely to that of the electrodes soldered to the silicon substrate and serving as the support for the substrate. By virtue of these features, the silicon substrate is scarcely subjected to thermal stress and thus protected not only from deterioration or degradation in the electrical characteristics thereof but also from injuries or destruction due to the thermal stress, whereby improved mechanical characteristics are also assured. In the semiconductor device having a silicon substrate of a large diameter, the bonded assembly of the silicon substrate and the electrodes is likely to be bent under influence of the thermal stress. Such bending can of course be reduced by minimizing the thermal stress. Accordingly, the structure according to the invention in which generation of the thermal stress is substantially suppressed can be advantageously applied to implementation of semiconductor devices of a large diameter or size.

Further, since the thermal conductivity is significantly improved, heat generated in the silicon substrate can be rapidly dissipated. Consequently, conduction of a large current will not involve deterioration of characteristics of the device under influence of heat generation.

In operation, the solder material undergoes certain thermal cycles. However, because the thermal stress is negligible, the capability of the semiconductor device to withstand thermal fatigue is significantly enhanced, whereby the reliability of the device is also improved.

Next, description will be made about an exemplary embodiment of the invention in which two types of the carbon fibers of high longitudinal elastic modulus and low longitudinal elastic modulus are intermingled throughout the whole structure of the Cu-C composite electrode.

A first bundle of 3000 carbon fibers each having a longitudinal elastic modulus of 20,000 to 31,000 kg f/mm² and a diameter of 6 to 7 μm and plated with copper in thickness of about 1 μm was prepared. This bundle is referred to as the carbon fiber bundle of low longitudinal elastic modulus. A second bundle of 3000 carbon fibers each having the longitudinal elastic modulus of 36,000 to 45,000 kg f/mm² and a diameter of 6 to 9 μm and plated with copper in thickness of about 1 μm was prepared. This bundle is referred to as the carbon fiber bundle of high longitudinal elastic modulus.

On the other hand, pulverized copper having a particle size on the order of 1 μm and an aqueous solution of methyl cellulose were mixed together to prepare a muddy or paste-like slurry of pulverized copper.

The first carbon fiber bundle of the low longitudinal elastic modulus and the second carbon fiber bundle of the high longitudinal elastic modulus were superposed in parallel to each other and impregnated with the pulverized copper slurry. Subsequently, the impregnated fiber bundles were wound on a rod-like core of copper having a diameter of 3 mm. After the copper core was removed, the cavity which was filled with the pulverized copper slurry.

Subsequently, the electrode assembly thus obtained was subjected to a hot press process in a mold of graphite at a temperature of 1000° C. under pressure of 250 kg f/cm². A spiral- or vortex-like electrode structure of the Cu-C composite material having a diameter of 30 mm and a thickness of 3 mm was obtained. The content of the intermingled carbon fibers of the finished electrode was 51% by volume.

The mean thermal expansion coefficient as measured over a temperature range from a room temperature to 300° C. was $3.6 \times 10^{-6}/°$ C.

In the case of an electrode made of only the carbon fiber bundle of the low elastic modulus under the same conditions for the purpose of comparison, the carbon fiber content required for attaining the mean thermal expansion coefficient of $3.6 \times 10^{-6}/°$ C. was in the range of 55 to 58% by volume.

As can be readily seen, the content of the carbon fiber in the electrode made of both kinds of the carbon fiber bundles is lower than that of the electrode made only of the carbon fiber of the low elastic modulus by 4 to 7% by volume.

In the case of the examples described above, the carbon fiber bundles are arrayed in a vortex-like configuration. However, the electrode of the Cu-C composite material according to the invention is never restricted to such arrangement, but can be equally realized in other dispositions of the fiber bundles such as a net-like array, an annular array and the like, as described hereinbefore.

In the hot press molding, the carbon fibers are tend to be so displaced as to be dispersed in the copper matrix with a uniform density. As a consequence, a difference in the thermal expansion coefficient may appear in the Cu-C composite material of the annular and spiral carbon bundle arrays when measured in the radial direction of the electrode. Such a difference may be cancelled by increasing correspondingly the density of carbon fibers in the peripheral portion of the electrode.

When the carbon fiber bundle of the high longitudinal elastic modulus is located at the outer periphery in the spiral or annular array, disposition should be made such that the longitudinal elastic coefficient be progressively decreased toward the center of the electrode. Further, when the density of the carbon fibers is to be increased in the outer peripheral portion, the density of distribution should be progressively decreased toward the center of the electrode. Then, the thermal stress ascribable to the difference in the thermal expansion coefficient can be minimized, whereby a much stabilized structure of the Cu-C composite electrode can be accomplished.

When a trace of titanium (Ti), zirconium (Zr), boron (B) and/or hafnium (Hf) is contained in the copper matrix, such elements will be alloyed with matrix copper on one hand and form carbides with the carbon fibers on the other hand, whereby the wettability of the carbon fibers to matrix copper is improved. Thus, a rigid and stable Cu-C composite material is obtained.

It goes without saying that the spiral- or vortex-like array may be adopted in combination with the annular array. In this case, when disposition is made such that the spiral-like array of the carbon fiber bundles is located at a radially inner region with the annular array of the carbon fiber bundles being positioned at the radially outer region, non-uniformity in distribution of the thermal expansion coefficient can be minimized.

The inventio is not restricted to the semiconductor device having a single pn-junction, but can be applied to semiconductor devices having two or more pn-junctions such as thyristors, triacs (lateral thyristors) and the like.

Figure 2:
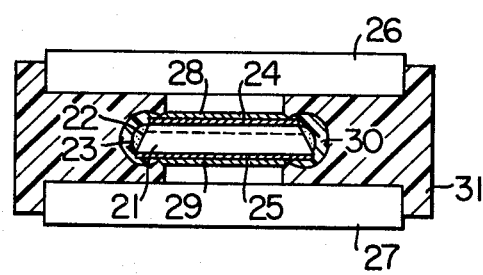
FIG. 2 is a view similar to FIG. 1 and shows another embodiment of the invention.

FIG. 2 shows another exemplary embodiment of the invention. The silicon substrate denoted by numeral 21 is of a beveled type in which a peripheral side of the substrate at which the pn-junction is exposed is beveled. A passivation glass layer 23 is deposited on the beveled peripheral side 22 through a firing process. Electrode films 24 and 25 made of nickel or the like are, respectively, formed on the upper and the lower principal surfaces of the substrate 21 in ohmic contact. Electrodes 26 and 27 of the Cu-C composite material realized according to the invention are attached to the electrode films 24 and 25 by means of solders 28 and 29, respectively. A buffer layer 30 is provided over the passivation glass layer 23. An epoxy resin body 31 is molded between the electrodes 26 and 27.

In the case of the embodiment shown in FIG. 2, each of the electrodes 26 and 27 has a hub-like protrusion which is bonded to the respective electrode films 24 and 25. In such configuration of the electrodes 26 and 27, the carbon fibers of the high longitudinal elastic coefficient are disposed at least at the outer peripheral portion, to thereby impart the low thermal expansion coefficient and the high thermal conductivity to the electrodes. Thus, a semiconductor device of an enhanced reliability is accomplished.

In the devices shown in FIGS. 1 and 2, the electrodes are destined to serve directly as the external electrodes. However, these electrodes may be implemented as inner electrodes which serve also as the auxiliary supporting plates.

The invention is not restricted to the resin-molded type semiconductor devices as illustrated but may be applied to other types of devices such as ceramic-sealed type, can-sealed type, glass-sealed type and the like hermetically sealed structures.

Figure 3:
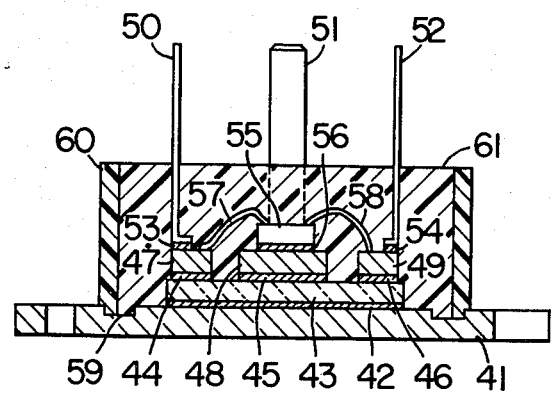
FIG. 3 shows a further embodiment of the invention.

FIG. 3 illustrates a semiconductor device of an insulation molded type according to still another embodiment of the invention.

An insulation plate 43 of alumina is bonded to a heat dissipating fin 41 of copper by means of solder 42. Electrodes 47, 48 and 49 are bonded onto the insulating plate 43 by solders 44, 45 and 46. The electrodes 47, 48 and 49 are attached to terminal leads 50, 51 and 52 by brazing masses or solders 53; 54. A silicon substrate 55 is bonded by solder 56 to the top of the electrode 48 serving as an inner electrode. The electrodes 47 and 49 are connected to the silicon substrate 55 by means of bonding wires 57 and 58, respectively. The heat dissipating fin 41 is formed with a groove 59 at a location corresponding to the periphery of the insulating plate 43. The lower edge of a case 60 made of epoxy resin is fitted into the groove 59. The interior of the case 60 is filled with an epoxy resin block 61 through an injection molding process.

The electrodes 48 is made of the Cu-C composite material according to the invention.

When the silicon substrate 55 is of a rectangular form, the electrode 48 may be either circular or rectangular. The square or rectangular electrode 48 may preferably be made of the Cu-C composite material of a net-like structure, in which a plurality of cloth or nets formed of the interlaced carbon fibers of high and low longitudinal elastic moduli are superposed one on another and hot-pressed to a desired thickness. Interlacing of the carbon fibers can be easily accomplished. Further, when the composite electrode material made of the interlaced carbon fibers in a large size is subsequently cut in a desired size for use, no anisotropy appears relative to the thermal expansion coefficient, to an advantage.

Although a single silicon substrate 48 is employed in the device shown in FIG. 3, it will be appreciated that the invention can equally be applied to a structure where a number of silicon substrates are disposed on associated electrodes.

We claim:

1. A semiconductor device comprising:
   (a) a semiconductor substrate having at least one pn-junction;
   (b) at least one electrode for supporting said semiconductor substrate, said electrode being made of a composite material in which carbon fibers are embedded in a ring-like shape in a copper matrix, the plane of the ring-like shape being substantially parallel with the surface of said electrode for supporting said semiconductor substrate; wherein at least the carbon fibers embedded in an outer peripheral portion of said electrode having a greater longitudinal elastic modulus than that of the carbon fibers embedded in a central portion of said electrode; and
   (c) brazing material for attaching said electrodes to said semiconductor substrate.

2. A semiconductor device according to claim 1, wherein said carbon fibers are embedded in the copper matrix in an array selected from a group consisting of an annular array, a spiral array and combinations of these arrays.

3. A semiconductor device according to claim 1, wherein density of distribution of the carbon fiber is decreased toward a center of said electrode from the outer-peripheral portion thereof.

4. A semiconductor device according to claim 1, wherein the copper matrix contains a minute amount of at least one element selected from the group consisting of titanium, zirconium, boron and hafnium.

5. A semiconductor device according to claim 1, wherein the longitudinal elastic modulus of said carbon fibers is decreased progressively toward a center of said electrode from the outer peripheral portion thereof.

6. A semiconductor device according to claim 1, wherein said ring-like shape of said carbon fibers comprises an arrangement wherein carbon fibers having a high longitudinal elastic modulus are formed in a net-like structure of intersecting lines to define at least one closed ring-like shape in said outer peripheral portion of said electrode, and wherein carbon fibers having a low longitudinal elastic modulus are embedded in said electrode within the boundaries of said closed ring-like shape formed by said high longitudinal elastic modulus carbon fibers.

7. A semiconductor device according to claim 3, wherein said density of distribution of the carbon fibers is progressively decreased toward the center of said electrode from the outer peripheral portion thereof.

8. A semiconductor device comprising:
   (a) a semiconductor substrate having at least one pn-junction;
   (b) at least one electrode for supporting said semiconductor substrate, said electrode being made of a composite material in which first and second types of carbon fibers are embedded in a copper matrix, wherein said first type of carbon fibers has a greater longitudinal elastic modulus than said second type of carbon fibers; and (c) brazing material for attaching said electrodes to said semiconductor substrate.

9. A semiconductor device according to claim 8, wherein said first type of carbon fiber is located in an outer peripheral portion of said electrode and said second type of carbon fibers is located in an inner portion of said electrodes enclosed by said outer peripheral portion.

10. A semiconductor device according to claim 9, wherein said first and second types of carbon fibers are intermingled with one another in said electrode.

11. A semiconductor device according to claim 10, wherein density of distribution of the carbon fiber is decreased toward a center of said electrode from the outer peripheral portion thereof.

12. A semiconductor device according to claim 11, wherein density of distribution of the carbon fiber is decreased toward a center of said electrode from the outer peripheral portion thereof.

13. A semiconductor device comprising:
(a) a semiconductor substrate having at least one pn-junction;
(b) at least one electrode for supporting said semiconductor substrate, said electrode being made of a composite material in which first and second types of carbon fibers are embedded in a copper matrix, said first type of carbon fibers having a greater longitudinal elastic modulus than said second type of carbon fibers, wherein said first type of carbon fibers is located in an outer peripheral portion of said electrode and said second type of carbon fibers is located in an inner portion of said electrode enclosed by said outer peripheral portion so that said outer peripheral portion of said electrode has a lower thermal expansion coefficient than said inner portion to restrict expansion of said inner portion, and further wherein a density of distribution of the carbon fibers is decreased toward a center of said electrode from the outer peripheral portion thereof so that said inner portion has a lower density of carbon fibers and a higher heat conductivity than said outer peripheral portion; and (c) brazing material for attaching said electrodes to said semiconductor substrate.

14. A semiconductor device according to claim 1, wherein carbon fibers embedded in said outer peripheral portion have a longitudinal elastic modulus of 36,000 to 45,000 kg f/mm$^2$ and carbon fibers embedded in said central portion have a longitudinal elastic modulus of 20,000 to 31,000 kg f/mm$^2$.

15. A semiconductor device according to claim 8, wherein said first type of carbon fibers has a longitudinal elastic modulus of 36,000 to 45,000 kg f/mm$^2$ and said second type of carbon fibers has a longitudinal elastic modulus of 20,000 to 31,000 kg f/mm$^2$.

16. A semiconductor device according to claim 13, wherein said first type of carbon fibers has a longitudinal elastic modulus of 36,000 to 45,000 kg f/mm$^2$ and said second type of carbon fibers has a longitudinal elastic modulus of 20,000 to 31,000 kg f/mm$^2$.

* * * * *